United States Patent
Takaike

(10) Patent No.: US 6,646,357 B2
(45) Date of Patent: Nov. 11, 2003

(54) SEMICONDUCTOR DEVICE AND METHOD OF PRODUCTION OF SAME

(75) Inventor: Eiji Takaike, Nagano (JP)

(73) Assignee: Shinko Electric Industries, Co. Ltd., Nagano (JP)

( * ) Notice: Subject to any disclaimer, the term of this patent is extended or adjusted under 35 U.S.C. 154(b) by 0 days.

(21) Appl. No.: 10/151,607

(22) Filed: May 20, 2002

(65) Prior Publication Data
US 2002/0175426 A1 Nov. 28, 2002

(30) Foreign Application Priority Data
May 25, 2001 (JP) .......................... 2001-157451

(51) Int. Cl.$^7$ .............................................. H01L 29/40
(52) U.S. Cl. .................... 257/784; 257/750; 257/692
(58) Field of Search ................. 257/784, 786, 257/781, 750, 692

(56) References Cited

U.S. PATENT DOCUMENTS

| 6,033,935 A | 3/2000 | Dozier, II et al. |
| 6,049,976 A | 4/2000 | Khandros |

*Primary Examiner*—Roy Potter
(74) *Attorney, Agent, or Firm*—Paul & Paul

(57) ABSTRACT

A semiconductor device provided with transistors or other semiconductor elements formed on a semiconductor substrate, external connection terminals connecting these elements to an external circuit, and interconnection patterns connecting electrodes of the semiconductor elements to the external connection terminals, wherein the external connection terminals are formed by wires comprised of a conductive material and the parts of the wires bonded to the interconnection patterns are buried in the metal layer forming the interconnection patterns. A method of production of the semiconductor device is also disclosed.

9 Claims, 12 Drawing Sheets

SEMICONDUCTOR DEVICE AND METHOD OF PRODUCTION OF SAME

BACKGROUND OF THE INVENTION

1. Field of the Invention

The present invention relates to a semiconductor device and a method of production of the same, more particularly relates to a semiconductor device produced by forming external connection terminals on an electrode formation surface of a semiconductor wafer and a method of production of the same.

2. Description of the Related Art

FIGS. 12A to 12I show a method of production of a semiconductor device formed with metal posts as external connection terminals on an electrode formation surface of a semiconductor wafer. In this method of production, first, an electrode formation surface of a semiconductor wafer 10 from which electrodes 12 are exposed and which is covered by a passivation film 14 (FIG. 12A) is covered with a conductive layer 16 by sputtering (FIG. 12B). Next, the surface of the conductive layer 16 is covered by a photosensitive resist 18 (FIG. 12C), then the photosensitive resist 18 is exposed and developed to expose portions for forming interconnection patterns at the surface of the conductive layer 16 (FIG. 12D).

The electrodes 12 are arranged at an extremely high density at for example the periphery of the electrode formation surface of the semiconductor wafer 10. As shown in FIG. 12E, the interconnection patterns 20 are formed by electroplating the exposed surfaces of the conductive layer 16 by copper. The interconnection patterns 20 are formed led out from the electrodes 12 so as to secure spaces for arrangement of the external connection terminals.

Next, the photosensitive resist 18 is removed and the surfaces of the interconnection patterns 20 and conductive layer 16 are covered by a dry film 22 (FIG. 12F), This dry film 22 is for forming the copper posts 24 forming the external connection terminals (FIG. 12G). The dry film 22 is exposed and developed to form holes for plating at portions for forming the copper posts 24 on the interconnection patterns 20. By electroplating these portions by copper, copper is built up in the plating holes and metal posts 24 of heights of about 100 μm are formed. Next, the surfaces of the copper posts 24 are successively plated by nickel, palladium, etc. to form the barrier layers 26.

The dry film 22 is removed, then the portions of the conductive layer 16 exposed at the electrode formation surface are removed by etching (FIG. 12H). In this way, the electrode formation surface of the semiconductor wafer 10 is formed with copper posts 24 electrically connected with the electrodes 12 through the interconnection patterns 20.

Next, as shown in FIG. 12I, the electrode formation surface of the semiconductor wafer 10 is covered with a resin 28 for sealing. The resin 28 is formed to substantially the same thickness as the copper posts 24. The end faces of the copper posts 24 are exposed at the surface of the resin 28. After the resin sealing, solder balls are placed on the surfaces of the barrier layers 26 and the solder made to reflow to form solder bumps (not shown). Finally, the semiconductor wafer 10 can be diced along with the resin 28 to obtain chip-sized semiconductor devices.

FIGS. 13A to 13I show another method for producing a chip-sized semiconductor device. The semiconductor device obtained by this method of production has gold wires bent in L-shapes for use as external connection terminals. The steps shown in FIGS. 13A to 13E are basically no different from the steps shown in the above FIGS. 12A to 12E. In this method, however, the interconnection patterns 20 are not sealed by resin. The interconnection patterns 20 are formed by gold plating so as to enable them to be left as they are exposed at the outside surface of the semiconductor device.

As shown in FIG. 13F, the photosensitive resist 18 (FIG. 13E) is removed. Next, as shown in FIG. 13G, the electrode formation surface is covered by a resist, then holes 30a are formed in the interconnection patterns 20 at portions for later bonding of the gold wires. The electrode formation surface is covered by the resist 30 so as to cover only the outer surfaces of the gold wires with reinforcement plating after bonding the gold wires. As shown in FIG. 13H, the gold wires are bonded to the interconnection patterns 20 in register with the openings 30a (FIG. 13G). Next, the gold wires are bent into L-shapes and the ends thereof are cut off to form the external connection terminals 32. The outer surfaces of the gold wires are plated to reinforce the wires (the plating material is not shown in the drawing), then the resist 30 is removed and, as shown in FIG. 13I, the exposed portions of the conductive layer 16 are removed by etching.

In this way, the electrode formation surface of the semiconductor wafer 10 is formed with external connection terminals 32 electrically connected with the electrodes 12 through the interconnection patterns 20. Finally, the semiconductor wafer 10 is diced to obtain semiconductor devices provided with external connection terminals 32 comprised of wires bent into L-shapes.

In the examples shown in the above FIGS. 12A to 12I and FIGS. 13A to 13I, the conductive layer 16 was formed on the passivation film 14, but it is also possible to cover the passivation film 14 by a polyimide film and form the conductive layer 16 on the surface of the polyimide film.

Steps for producing a semiconductor device using the above copper posts as external connection terminals and steps for producing a semiconductor device using gold wires bent into L-shapes as external connection terminals are shown in FIGS. 14 and 15. The steps produce chip-sized semiconductor devices by processing the semiconductor wafer to form external connection terminals electrically connected to the electrode terminals formed on it, then dicing the semiconductor wafer. In this way, the methods of the prior art utilize complicated steps, so there are the problems that the production efficiency is reduced and the manufacturing costs increased.

Further, there have been the following problems when mounting a semiconductor device produced by a method of production of the prior art to a board: When mounting a semiconductor device using copper posts as external connection terminals by solder, the solder does not form meniscuses and the external connection terminals are not reliably bonded with the board. When mounting a semiconductor device provided with external connection terminals formed by bending gold wires in L-shapes, due in part to the fact that the heights of the external connection terminals are about 700 to 800 μm, the semiconductor device and the board are bonded spaced away from each other.

SUMMARY OF THE INVENTION

The present invention was made to solve the problems in the methods of production of the prior art for producing semiconductor devices by processing a semiconductor wafer. An object of the present invention is to provide a highly reliable semiconductor device able to be produced by a simpler method and thereby able to improve the production efficiency and able to arrange external connection terminals at a higher density and thereby able to handle a greater number of pins and a method of production of the same.

To attain the above object, according to a first aspect of the present invention, there is provided a semiconductor device provided with semiconductor elements, such as transistors, formed on a semiconductor substrate, external connection terminals connecting these elements to an external circuit, and interconnection patterns connecting electrodes of the semiconductor elements to the external connection terminals, wherein the external connection terminals are formed by wires comprised of a conductive material and the parts of the wires bonded to the interconnection patterns are buried in the metal layer forming the interconnection patterns.

The metal layer forming the interconnection patterns is preferably formed by copper plating, gold plating or the like.

As the wires of the conductive material forming the external connection terminals, it is preferable to use gold wires, copper wires, etc.

More preferably, the metal layer and the wires are fabricated by the same material. Therefore, preferably the metal layer is formed by gold plating and the wires are comprised of gold or the metal layer is formed by copper plating and the wires are comprised of copper.

The external connection terminals can be covered by the material of the metal layer forming the interconnection patterns.

The surface of the semiconductor device where the interconnection patterns are formed can be sealed so as to leave exposed the external connection terminals.

According to a second aspect of the present invention, there is provided a method of production of a semiconductor device provided with semiconductor elements formed on a semiconductor substrate, external connection terminals connecting the elements to an external circuit, and interconnection patterns connecting electrodes of the semiconductor elements to the external connection terminals, comprising the steps of forming a conductive layer on the entire surface of the semiconductor substrate where the electrodes are formed, forming a resist pattern on the surface of the conductive layer exposing the conductive layer at portions where pads to which the external connection terminals are to be connected and the interconnection patterns are to be formed, bonding wires comprised of a conductive material to the conductive layer at portions where the pads are to be formed to form external connection terminals, forming a metal layer at the exposed portions of the conductive layer, removing the resist, and removing the conductive layer exposed by the removal of the resist to form interconnection patterns.

After forming the interconnection patterns, it is possible to seal the surface of the semiconductor device where the interconnection patterns are formed so as to leave exposed the external connection terminals.

BRIEF DESCRIPTION OF THE DRAWINGS

These and other objects and features of the present invention will become clearer from the following description of the preferred embodiments given with reference to the attached drawings, wherein:

FIG. 7A is an enlarged sectional view of a portion bonding an external connection terminal with an interconnection pattern in a semiconductor device according to the present invention, while

FIG. 8A is an enlarged sectional view of a portion bonding an external connection terminal with an interconnection pattern in another semiconductor device according to the present invention, while

FIG. 10A is a view of a semiconductor device according to the present invention mounted on a board, while

FIG. 11A is a view of another semiconductor device according to the present invention mounted on a board, while

DESCRIPTION OF THE PREFERRED EMBODIMENTS

Preferred embodiments of the present invention will be described in detail below while referring to the attached figures.

FIGS. 1A to 1I are views for explaining a method of production of a semiconductor device according to a first embodiment of the present invention.

Figure 1A:
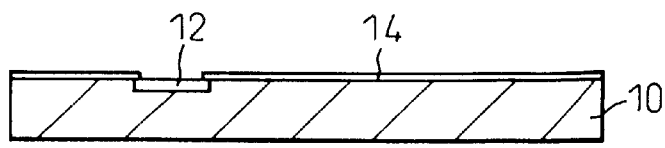
FIGS. 1A to 1I are views for explaining a method of production of a semiconductor device according to a first embodiment of the present invention.
Figure 1B:
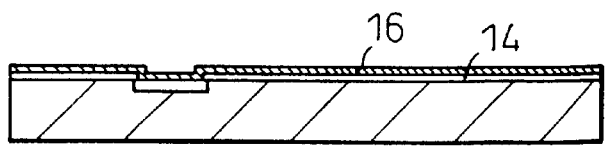

As shown in FIG. 1A, the surface of a semiconductor wafer 10 formed with electrodes 12 is covered by passivation film 14 leaving the electrodes 12 exposed. In the method of production of a semiconductor device of this embodiment, a conductive layer 16 is formed on the electrode formation surface of the semiconductor wafer 10 (FIG.

1B). In the present embodiment, a chromium layer is formed by sputtering, then a copper layer is formed by sputtering to obtain the conductive layer 16. The surface of the passivation film 14 may be formed with a polyimide or other electrical insulating layer (not shown) as a protective film, then the conductive layer 16 formed.

Figure 1C:
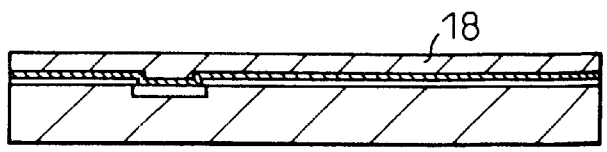
Figure 1D:
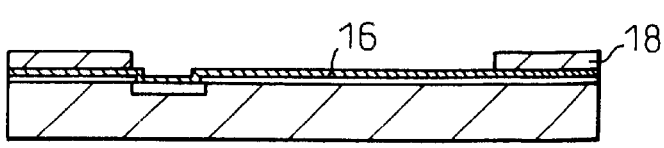

Next, a photosensitive resist 18 is coated on the entire electrode formation surface of the semiconductor wafer 10 to cover the surface of the conductive layer 16 by the photosensitive resist 18 (FIG. 1C). The photosensitive resist 18 is exposed and developed for patterning to, as shown in FIG. 1D, leave exposed only the portions for forming the interconnection patterns for rewiring on the surface of the conductive layer 16.

Figure 5:
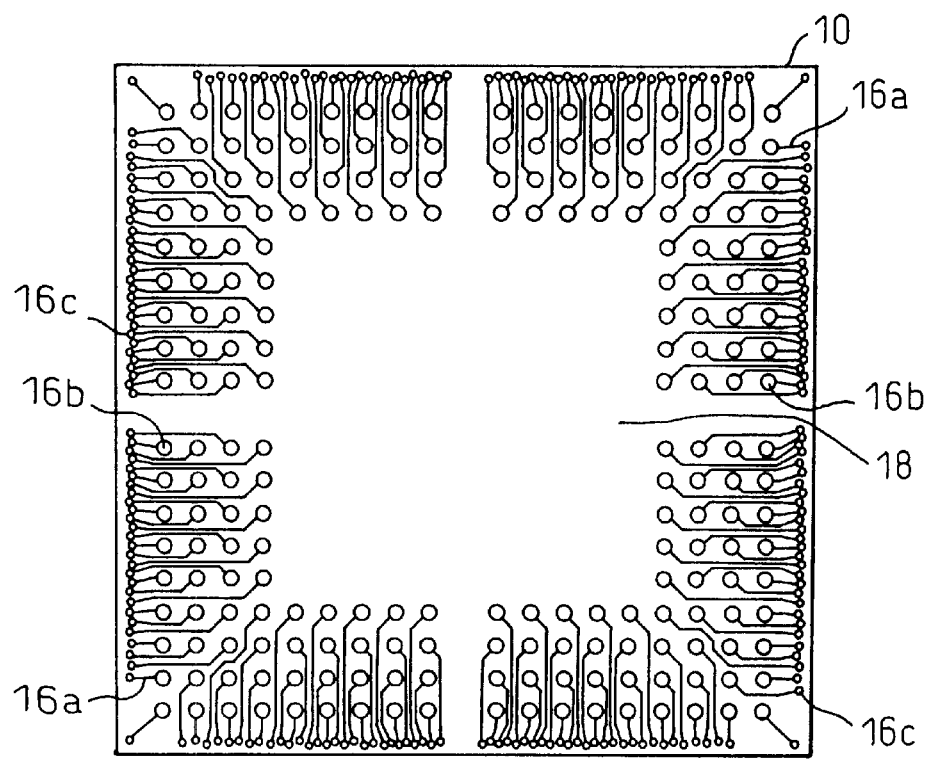
FIG. 5 is a plan view of the state of etching of a photosensitive resist covering an electrode formation surface of a semiconductor wafer.

FIG. 5 is a plan view of one chip section of the semiconductor wafer in the state with the photosensitive resist 18 exposed and developed. Reference numeral 18 indicates a photosensitive resist covering the electrode formation surface of the semiconductor wafer 10, 16a portions where the conductive layer 16 is left exposed in accordance with the arrangement of the interconnection patterns, 16b portions forming pads formed at the ends of the interconnection patterns, and 16c portions of base ends of the interconnection patterns connected to the electrodes 12.

Figure 1E:
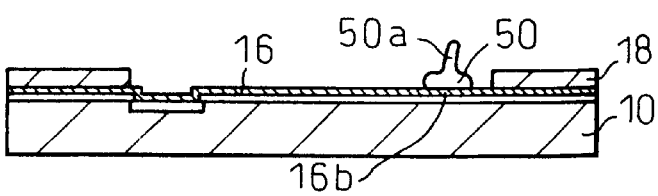

The method of production of a semiconductor device of the present embodiment is characterized by the formation of external connection terminals 50 by the method of bonding copper wires to portions 16b forming the pads after patterning the photosensitive resist 18 as shown in FIG. 1E. At the time of the wire bonding, the tips of the copper wires are melted into ball shapes, the ball-shaped portions are bonded with the portions 16b forming the pads, then the wires are pulled up and cut, whereby external connection terminals 50 with projections 50a made of the wires projecting up from the ball-shaped portions are formed. In this way, external connection terminals 50 are formed at all of the portions 16b forming the pads formed on the electrode formation surface.

In this method, since the external connection terminals 50 are formed by wire bonding, the work is extremely efficient. Further, the external connection terminals 50 can be formed using conventional bonding tools. Further, since the tips of the copper wires are shaped into balls and bonded with the conductive layer 16 and then the copper wires are cut while being pulled up to form the external connection terminals 50, the operation of bending the wires to L-shapes as in the prior art is not required, the dimensions and shapes of the external connection terminals 50 are easily kept uniform, and the work can be performed efficiently.

Figure 1F:
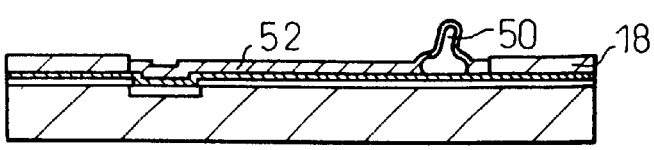

Next, the exposed surfaces of the conductive layer 16 are electroplated with copper to form the interconnection patterns 52 as shown in FIG. 1F. At this time, as illustrated, the surfaces of the external connection terminals 50 are also covered by copper plating. Next, the surfaces of the external connection terminals and the surfaces of the interconnection patterns 52 are plated to prevent diffusion of the solder at the time of mounting. In the present embodiment, they were successively plated with nickel, palladium, and gold.

Figure 1G:
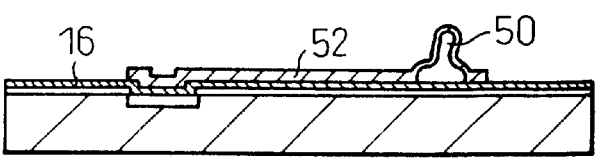
Figure 1H:
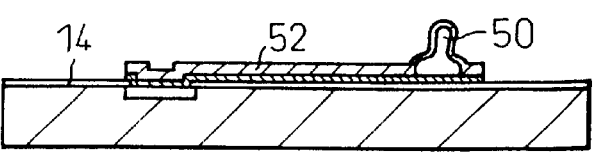

Next, as shown in FIG. 1G, the photosensitive resist 18 (FIG. 1F) is removed from the electrode formation surface of the semiconductor wafer 10, then the exposed portions of the conductive layer 16 are etched away (FIG. 1H). The conductive layer 16, which has a thickness of the order of 0.5 to 1 micrometer, is formed far thinner than the copper plating forming the interconnection patterns 52, which has a thickness of the order of 5 to 20 micrometers, so can be easily removed, and the etching for removing the conductive layer 16 does not have, in practice, an effect on the interconnection patterns 52. The exposed portions of the conductive layer 16 can be removed without covering the interconnection patterns 52 by a resist etc. Due to this, the passivation film 14 is exposed and the interconnection patterns 52 become independent.

Figure 1I:
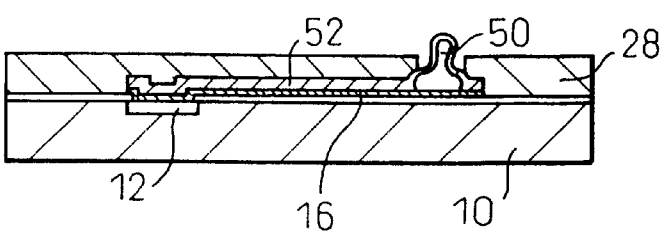
Figure 6:
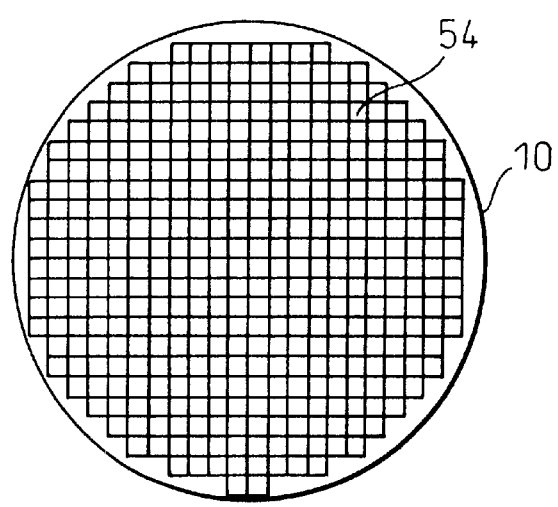
FIG. 6 is a view of a semiconductor wafer for forming a large number of semiconductor devices before dicing.

Next, the electrode formation surface of the semiconductor wafer 10 is sealed by a resin to seal the interconnection patterns 52 and the passivation film 14 by the resin 28 (FIG. 1I). In the resin sealing step, a transfer mold method using a sealing mold or a potting method is used. Due to the resin sealing step, a semiconductor wafer 10 with external connection terminals 50 projecting from a resin sealed surface is obtained. FIG. 6 shows the thus obtained semiconductor wafer 10. By dicing this, individual semiconductor devices 54 are obtained.

FIGS. 2A to 2H are views for explaining a method of production of a semiconductor device according to a second embodiment of the present invention. The method of production of this embodiment is basically the same as the method of production of the above embodiment, but in this embodiment, after forming the interconnection patterns for rewiring on the electrode formation surface of the semiconductor wafer, the electrode formation surface is left as it is without sealing by a resin in the final product.

Figure 2A:
FIGS. 2A to 2H are views for explaining a method of production of a semiconductor device according to a second embodiment of the present invention.
Figure 2B:
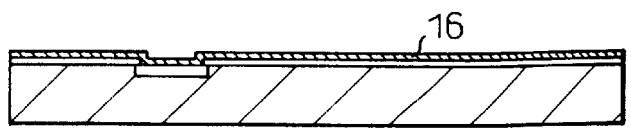
Figure 2C:
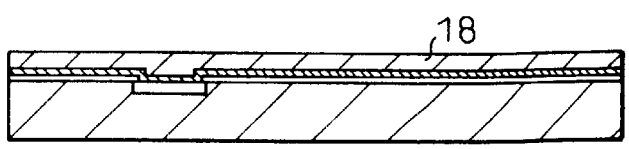
Figure 2D:
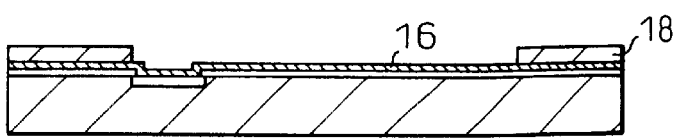

As shown in FIG. 2A, the surface of a semiconductor wafer 10 formed with electrodes 12 is covered by a passivation film 14 leaving the electrodes 12 exposed, then, as shown in FIG. 2B, a conductive layer 16 is formed. In the present embodiment, chromium, titanium-tungsten alloy, and gold are deposited in that order on the electrode formation surface by sputtering to form the conductive layer 16.

Next, a photosensitive resist 18 is coated on the surface of the conductive layer 16 (FIG. 2C), then the photosensitive resist 18 is exposed and developed for patterning (FIG. 2D) so as to expose the portions 16a (FIG. 5) later forming the interconnection patterns, portions 16b (FIG. 5) forming the pads, and portions 16c (FIG. 5) connecting with the electrodes 12 at the surface of the conductive layer 16.

Figure 2E:
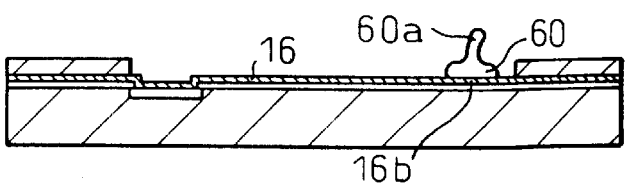
Figure 2F:
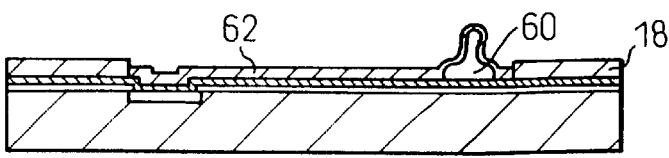

Next, as shown in FIG. 2E, gold wires are bonded to the portions 16b forming the pads to form the external connection terminals 60. Also when forming external connection terminals 60 using gold wires, external connection terminals 60 having projections 60a at their tops are formed, in the same way as the above embodiment, by melting the tips of the gold wires into balls, bonding the ball-shaped portions to the portions 16b forming the pads, then pulling up and cutting the wires.

Using the conductive layer 16 as a plating power feed layer, the exposed surfaces of the conductive layer 16 are electroplated with gold to form the interconnection patterns 62 as shown in FIG. 1F. In the present embodiment, since the interconnection patterns 62 are left exposed at the outer surface of the semiconductor device in the final product, the interconnection patterns 62 are formed by gold plating. By gold plating, as illustrated, the surfaces of the external connection terminals 60 are covered by gold plating as well.

Figure 2G:
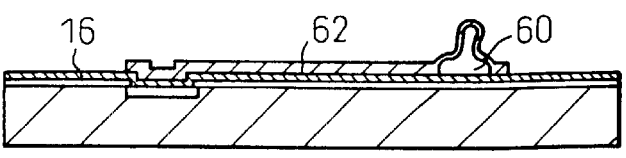
Figure 2H:
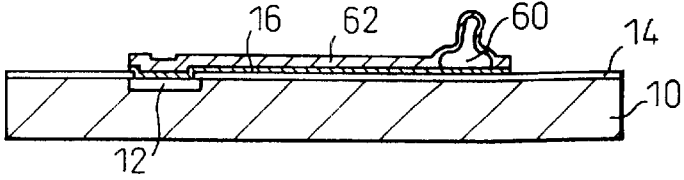

Next, as shown in FIG. 2G, the photosensitive resist 18 (FIG. 2F) is removed from the electrode formation surface of the semiconductor wafer 10, then the exposed portions of the conductive layer 16 are etched away (FIG. 2H). Due to this, the passivation film 14 is exposed and the interconnection patterns become independent.

The semiconductor device is obtained by dicing the semiconductor wafer into individual chips. In the case of the present embodiment as well, after making the interconnection patterns 62 independent (after step explained at FIG. 2H), it is possible to cover the electrode formation surface of the semiconductor wafer 10 by a resin (not shown) so as to leave exposed the tips of the external connection terminals.

Figure 3:
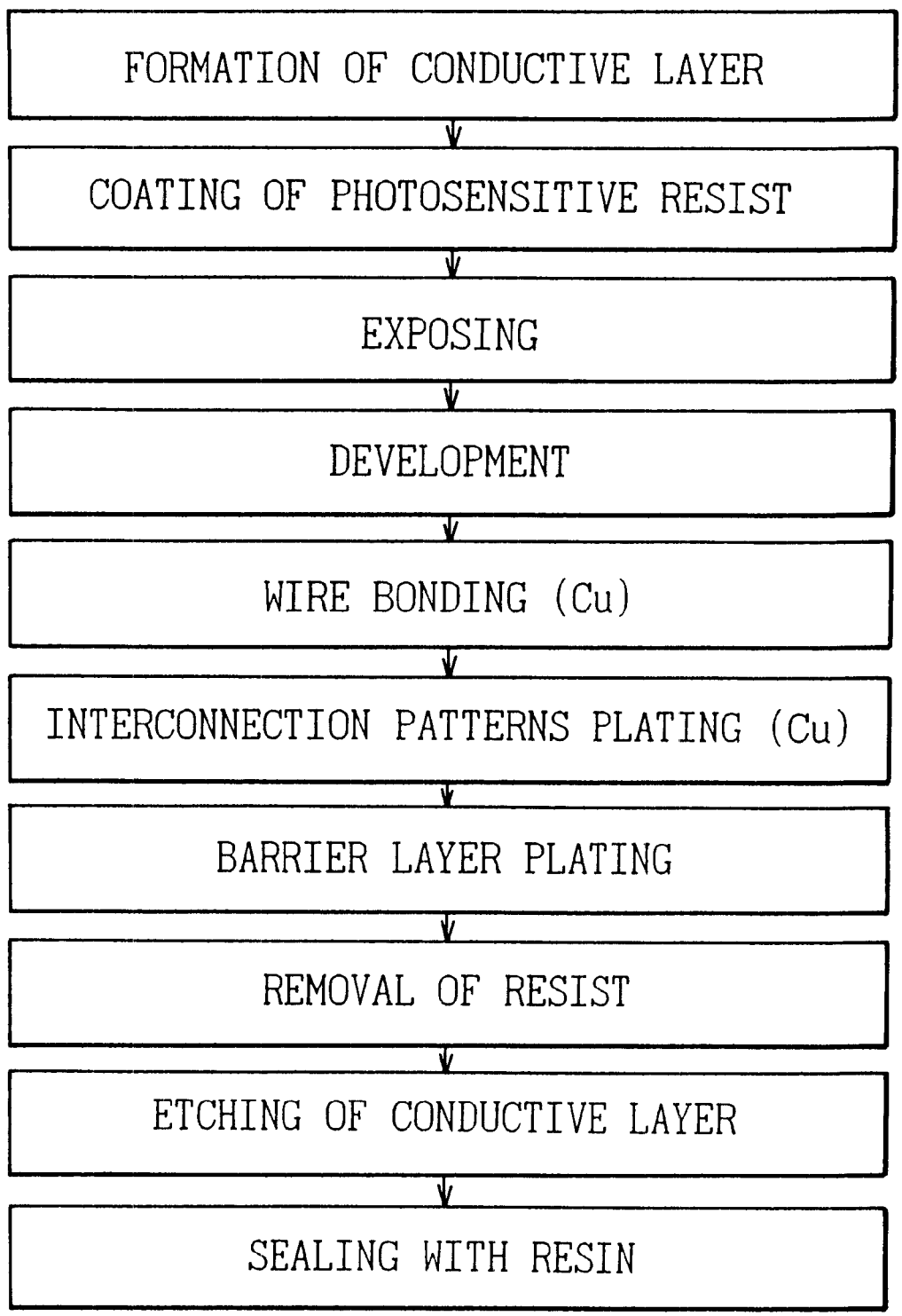
FIG. 3 is a flow chart of a method of production of a semiconductor device according to the first embodiment of the present invention.
Figure 4:
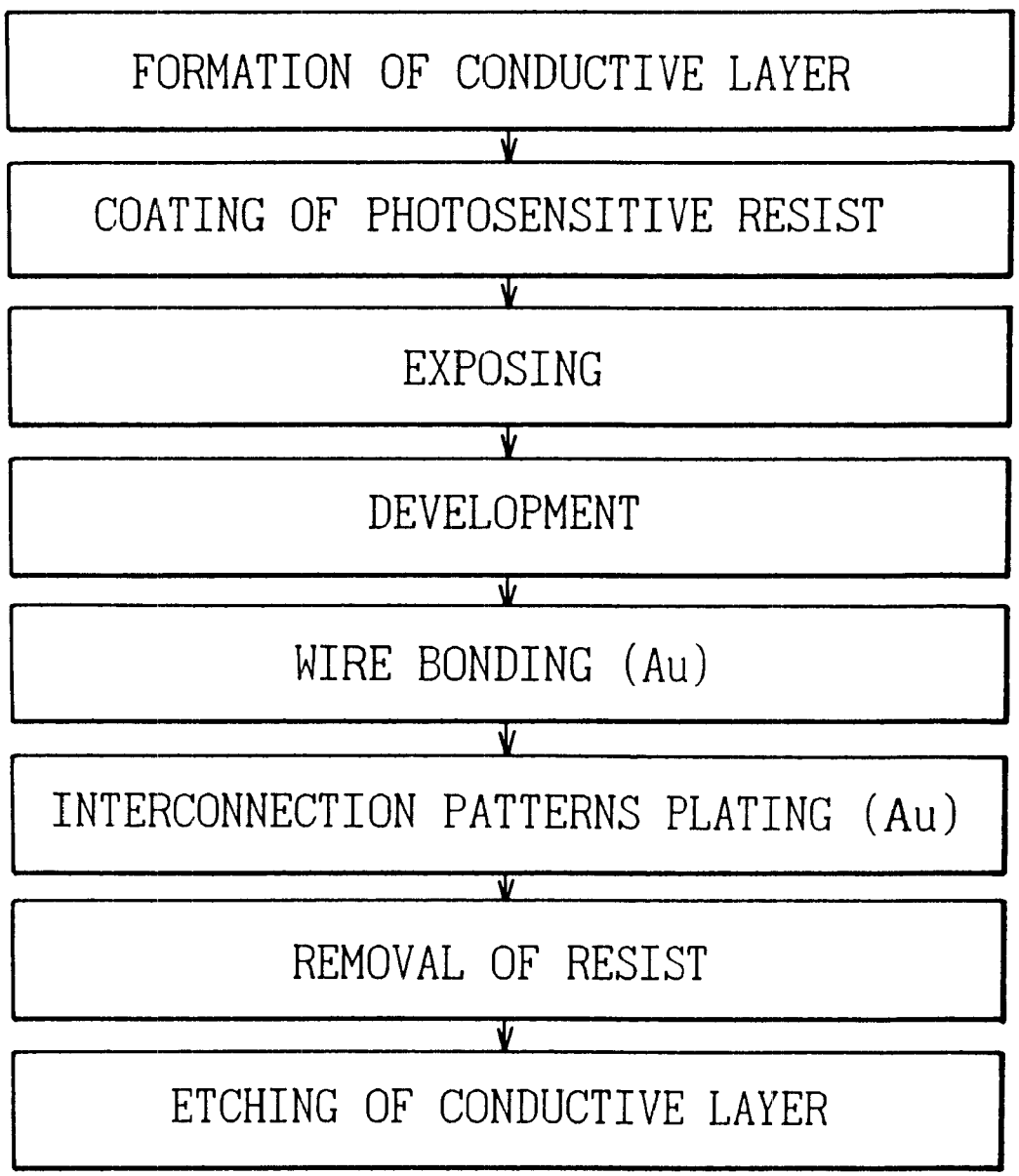
FIG. 4 is a flow chart of a method of production of a semiconductor device according to the second embodiment of the present invention.

FIG. 3 is a flow chart of the method of production of a semiconductor device according to the first embodiment of the present invention, while FIG. 4 is a flow chart of the method of production according to the second embodiment.

Figure 14:
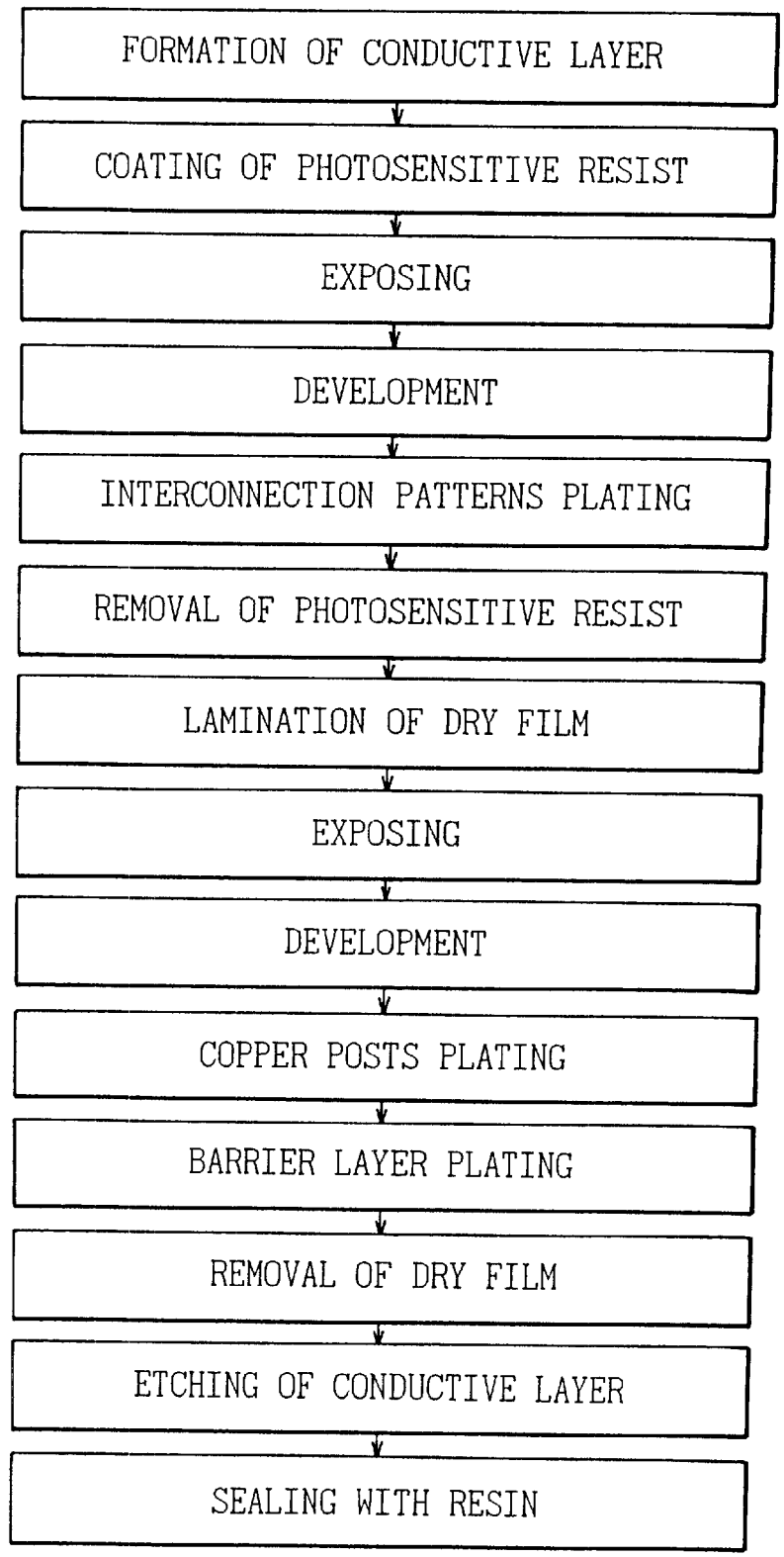
FIG. 14 is a flow chart of the method of production of a semiconductor device of the prior art shown in FIGS. 12A to 12I.
Figure 15:
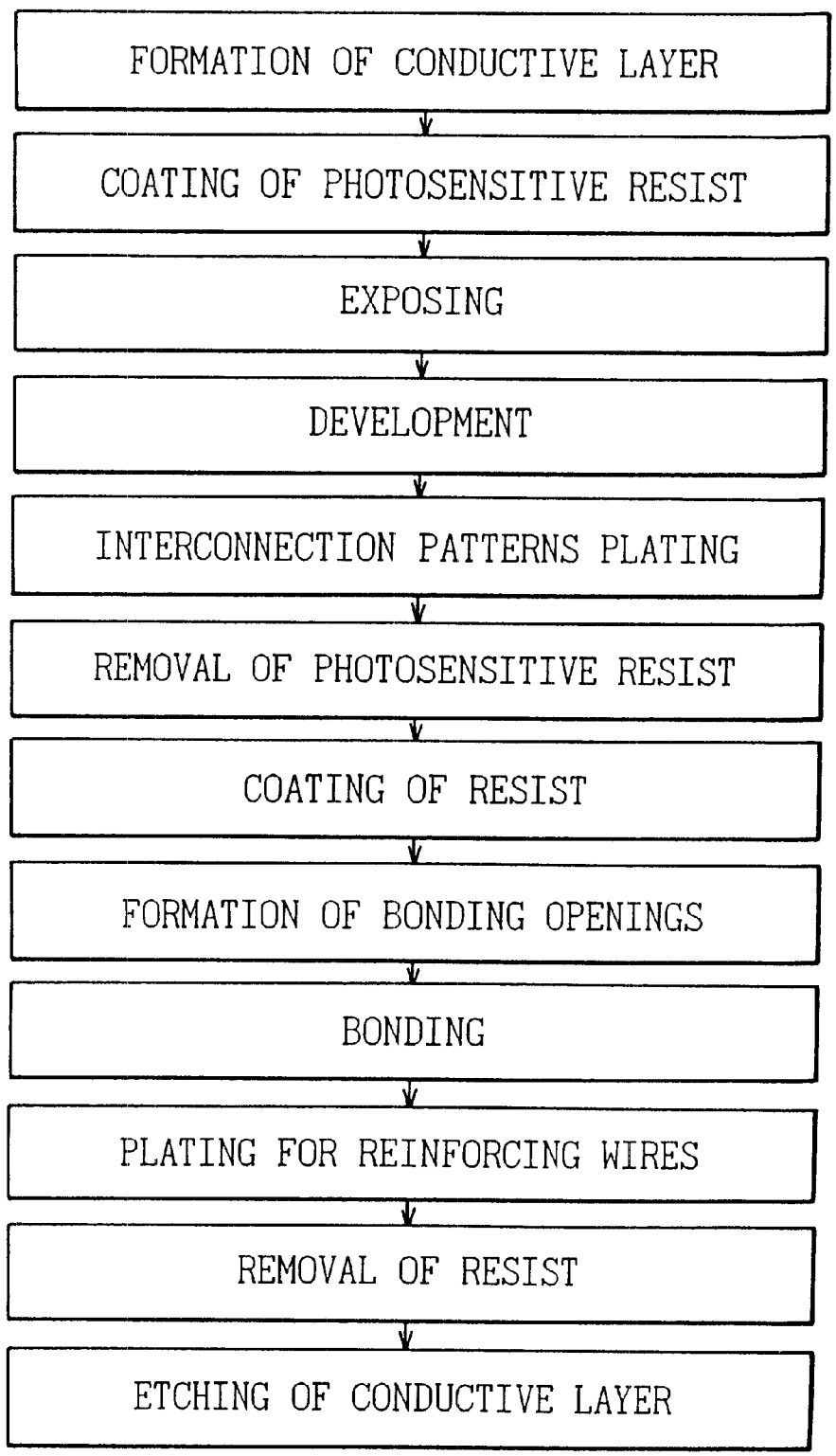
FIG. 15 is a flow chart of the method of production of a semiconductor device of the prior art shown in FIGS. 13A to 13I.

Comparing the method of the present invention shown in FIGS. 3 and 4 and the methods of production of a semiconductor device of the related art shown in FIGS. 14 and 15, in the case of the method of the prior art for producing a semiconductor device by forming copper posts as the external connection terminals (FIG. 14), the operation of laminating a dry film for forming the copper posts 24 or building up copper posts 24 by copper plating was necessary. As opposed to this, according to the method of the present invention, since the external connection terminals are formed by wire bonding using copper wires or gold wires, the production process can be simplified and external connection terminals can be formed easily.

In the case of the method of the prior art for producing a semiconductor device by forming external connection terminals by bending wires in an L-shape (FIG. 15), a step of bending the wires into the L-shape is required. Further, the operations of coating a resist for giving a reinforcing plating to the external connection terminals and exposing and developing the resist are necessary. As opposed to this, according to the method of the present invention, it is possible to form external connection terminals by the simple wire bonding step. Further, the external connection terminals are given reinforcing plating by the copper plating for forming the interconnection patterns without requiring coating, exposure, and development of a resist.

Figure 7A:
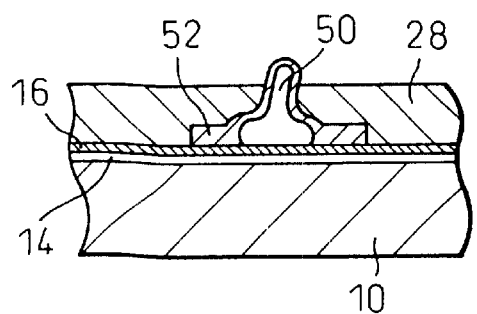
Figure 7B:
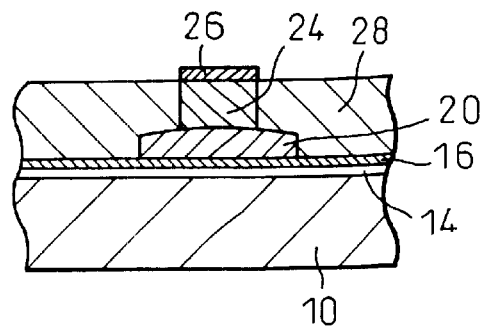
FIG. 7B is an enlarged sectional view of a portion bonding an external connection terminal with an interconnection pattern in a semiconductor device of the prior art.
Figure 8A:
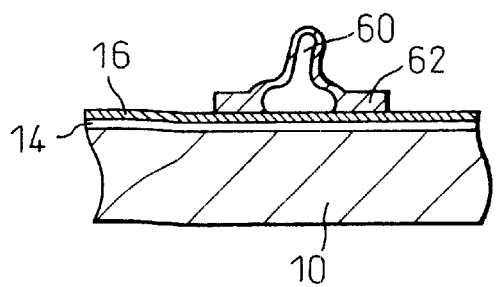
Figure 8B:
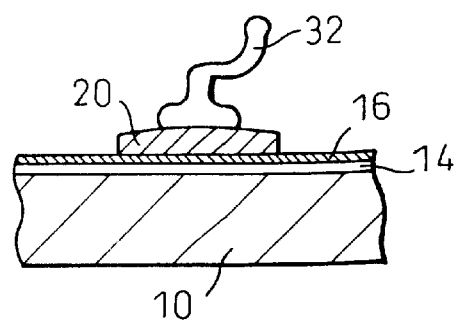
FIG. 8B is an enlarged sectional view of a portion bonding an external connection terminal with an interconnection pattern in another semiconductor device of the prior art.

The semiconductor device produced by the method of the present invention has the configurations differing from the configurations of the semiconductor devices of the prior art in the bonding portions between the external connection terminals and the interconnection patterns, so exhibits different actions and effects from the semiconductor devices of the prior art. FIGS. 7A and 7B and FIGS. 8A and 8B are enlarged sectional views of bonding portions of external connection terminals and interconnection patterns of semiconductor devices obtained by the method of production of a semiconductor device according to the present invention and methods of production of a semiconductor device of the prior art. FIGS. 7A and 7B show examples of semiconductor devices sealing the electrode formation surfaces with a resin after formation of the interconnection patterns, while FIGS. 8A and 8B show examples of semiconductor devices with interconnection patterns exposed.

As shown in FIG. 7A and FIG. 8A, in the case of the method of production of a semiconductor device according to the present invention, after forming the conductive layer 16, copper wires or gold wires are bonded directly to the conductive layer 16 to form external connection terminals 50 and 60, then interconnection patterns 52 and 62 are formed by copper plating or gold plating. As opposed to this, in the methods of the related art, as shown in FIGS. 7B and 8B, after the interconnection patterns 20 are formed, copper posts 24 or external connection terminals 32 made of gold wires are formed as external connection terminals on the surface of the interconnection patterns 20.

In this way, in the case of the present invention, the external connection terminals 50 and 60 are bonded to the conductive layer 16 and the base sides (bonding parts) of the external connection terminals 50 and 60 are buried in the copper plating layer or gold plating layer forming the interconnection patterns 52 and 62. Therefore, in the case of the semiconductor device according to the present invention, compared with that of the prior art, the height of the external connection terminals can be lowered by at least the amount of thickness of the interconnection patterns 52 and 62. Due to this, the method of production of a semiconductor device according to the present invention is effective in forming the semiconductor device thin and compact. Further, as clear from a comparison of FIG. 8A and FIG. 8B, in the case of the present invention, the overall height of the external connection terminals 60 becomes low. Due to this as well, according to the invention, the semiconductor device can be produced compactly as a whole.

Further, when using the method of production of a semiconductor device according to the present invention, since the copper wires or gold wires are directly bonded to the conductive layer 16 to form the external connection terminals 50 and 60, there is the advantage that the external connection terminals can be formed while being stably supported.

Figure 9A:
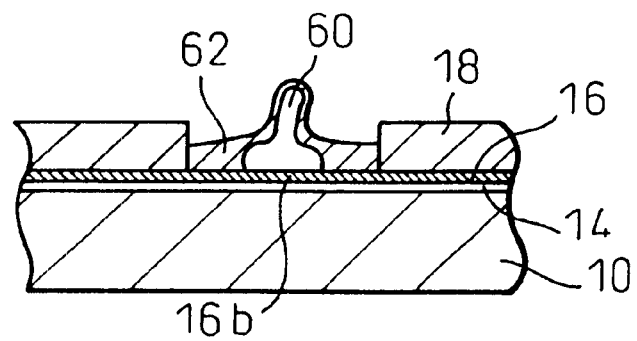
FIGS. 9A to 9C are views for explaining bonding of a copper wire or gold wire with the conductive layer in the present invention.
Figure 9B:
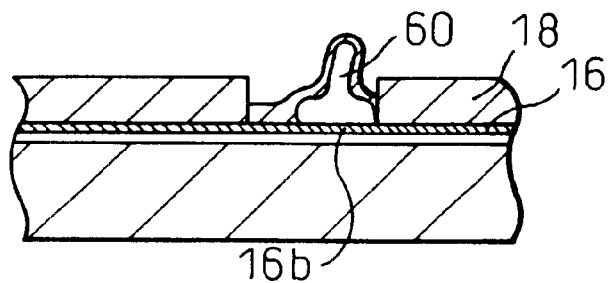
Figure 9C:
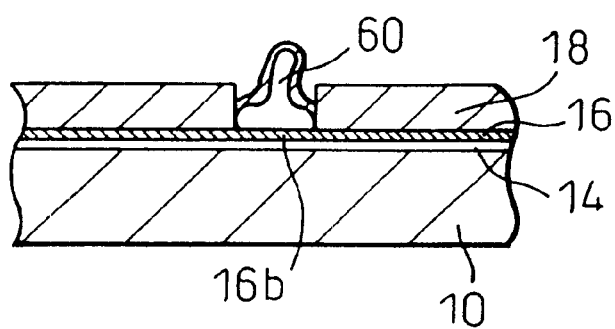

FIGS. 9A to 9C show external connection terminals 60 formed by bonding gold wires to portions 16b of the conductive layer 16 forming pads and exposed at openings of a patterned resist 18. FIG. 9A shows the case where the opening of the resist 18 defining the portion 16b forming the pad is formed larger than the bonding part of the gold wire. In this case, the gold wire is merely bonded to the portion 16b at its bottom. FIG. 9B shows the case where the opening is formed somewhat smaller than the case of FIG. 9A. The gold wire is bonded to the portion 16b at its bottom. Part of the sides of the bonding part of the gold wire is in contact with the sides of the photosensitive resist 18. FIG. 9C shows the case where the opening is of a size approximately the same as the bonding part of the gold wire. The bottom of the gold wire is bonded to the portion 16b forming the pad. The sides of the bonding part of the gold wire are in overall contact with the sides of the photosensitive resist 18.

In this way, according to the method of forming external connection terminals by bonding gold wires or copper wires directly to the conductive layer 16, since the gold wires or copper wires are bonded to the conductive layer 16 and the bonding parts of the gold wires or copper wires are supported by the photosensitive resist 18, slanting of the external connection terminals 50 and 60 is prevented and the gold wires or copper wires can be reliably bonded to the conductive layer 16. Further, by bonding the external connection terminals 50 and 60 to the conductive layer 16, then covering the conductive layer 16 by copper plating or gold plating and simultaneously supporting the base parts (bonded parts) of the external connection terminals 50 and 60 by burying them in the interconnection patterns 52 and 62 by copper plating or gold plating, the external connection terminals 50 and 60 are further reliably supported.

Figure 10A:
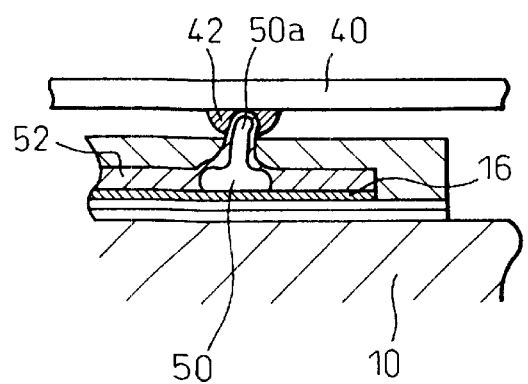
Figure 10B:
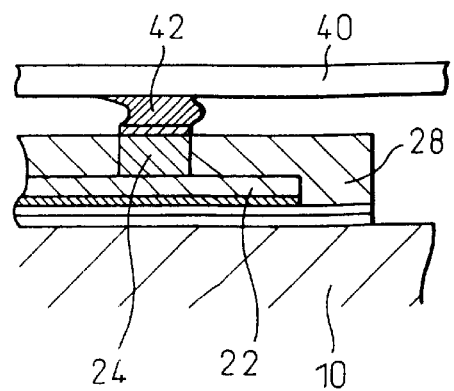
FIG. 10B is a view of a semiconductor device of the prior art mounted on a board.

FIGS. 10A and 10B and FIGS. 11A and 11B show comparisons of semiconductor devices of the present invention mounted on boards as opposed to semiconductor devices of the prior art mounted on boards. FIGS. 10A and 10B show a comparison of a semiconductor device according to the present invention (FIG. 10A) and a semiconductor device of the prior art using copper posts as external connection terminals (FIG. 10B). As shown in FIG. 10B, when mounting a semiconductor device formed with copper posts 24 onto a board 40 by solder 42, only the barrier layers 26 formed at the end faces of the copper posts 24 are exposed at the surface of the resin 28 with its poor solder wettability. Therefore, the solder 42 sometimes does not form a meniscus suitable for bonding with the copper posts. As opposed to this, when mounting the semiconductor device according to the present invention, as shown in FIG. 10A, due to the projections 50a projecting from the external connection terminals 50, the solder 42 forms a sufficient meniscus and therefore the device is reliably mounted to the board.

Figure 11A:
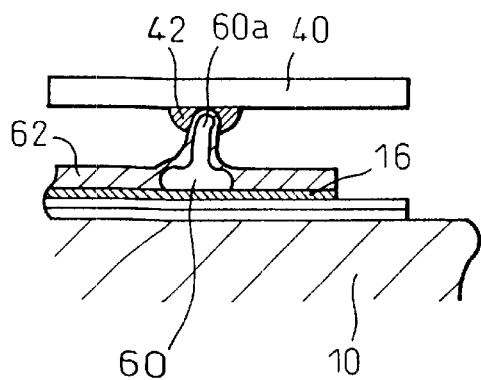
Figure 11B:
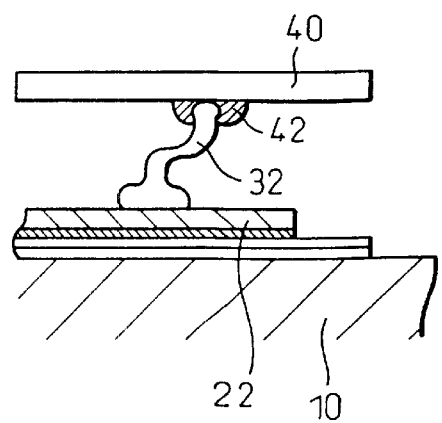
FIG. 11B is a view of another semiconductor device of the prior art mounted on a board.
Figure 12A:
FIGS. 12A to 12I are views explaining a method of production of a semiconductor device of the prior art.
Figure 12B:
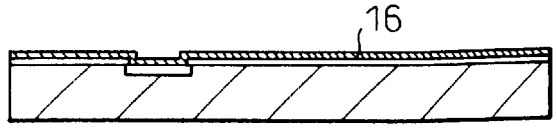
Figure 12C:
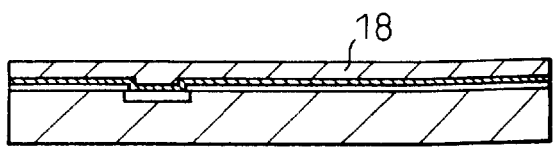
Figure 12D:
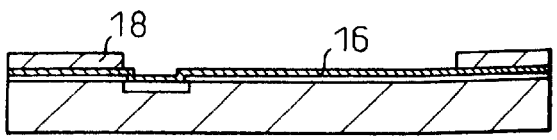
Figure 12E:
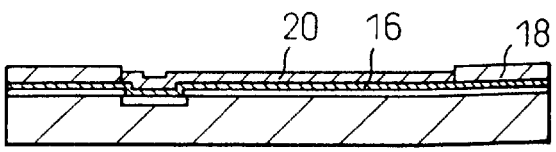
Figure 12F:
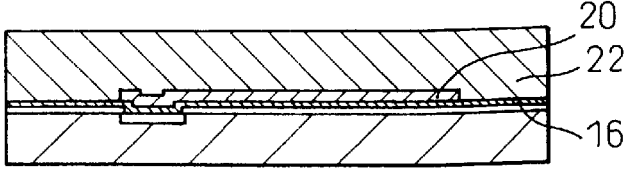
Figure 12G:
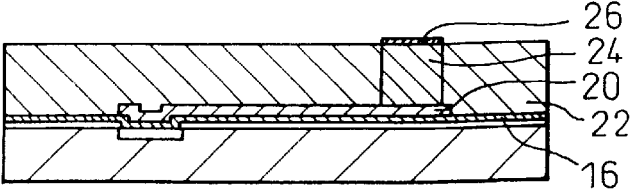
Figure 12H:
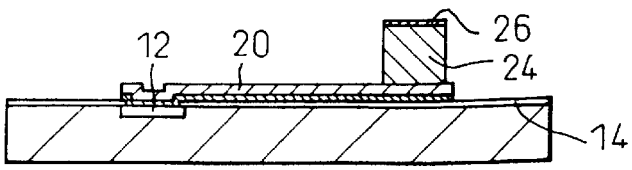
Figure 12I:
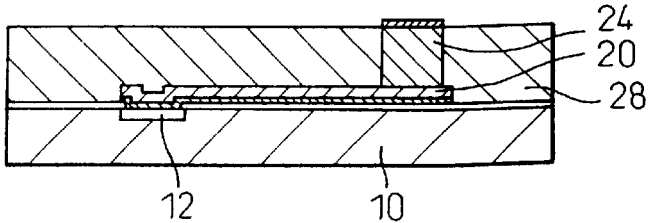
Figure 13:
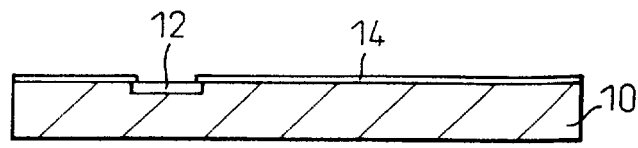
FIGS. 13A to 13I are views explaining another method of production of a semiconductor device of the prior art.
Figure 13:
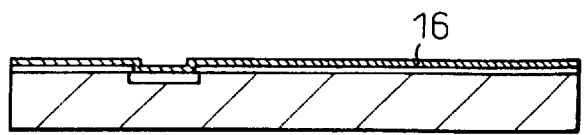
Figure 13:
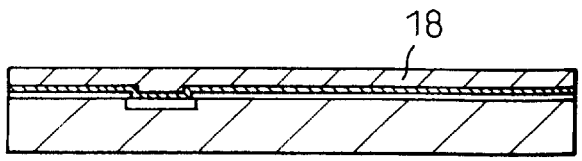
Figure 13:
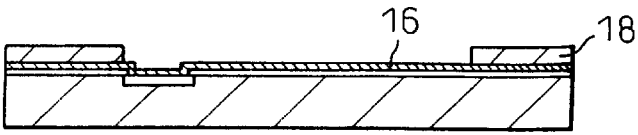
Figure 13:
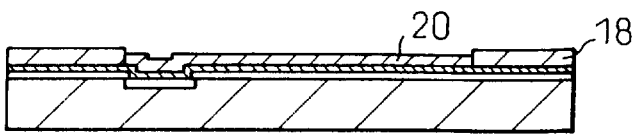
Figure 13:
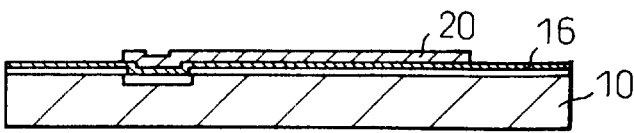
Figure 13:
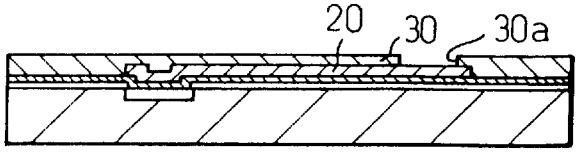
Figure 13:
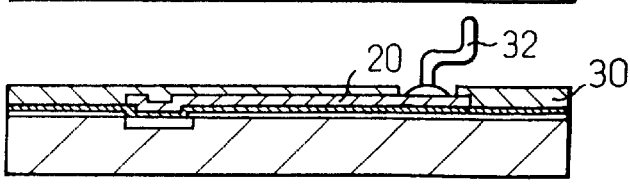
Figure 13:
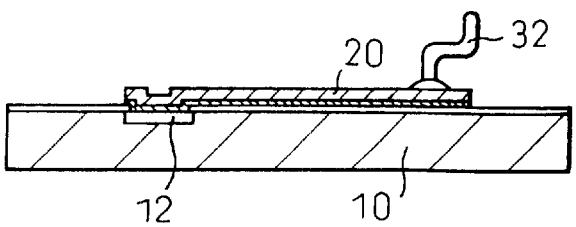

FIGS. 11A and 11B show a comparison of a semiconductor device of the present invention with interconnection patterns exposed (FIG. 11A) and a semiconductor device of the prior art (FIG. 11B). As shown in FIG. 11B, when mounting a semiconductor device of the prior art provided with external connection terminals 32 formed by bending gold wires into L-shapes onto a board 40, the tips of the external connection terminals 32 are brought into abutment with the board 40 for bonding and therefore the semiconductor device and the board 40 are spaced away from each other. As opposed to this, when mounting the semiconductor device according to the present invention on a board 40, as shown in FIG. 11A, solder 42 is deposited in a meniscus on projections 60a of the external connection terminals 60 and therefore the semiconductor device and board 40 are reliably bonded and, also, the distance between the semiconductor device and board 40 can be shortened.

In this way, the semiconductor device according to the present invention can be reliably mounted to a board so as to guarantee a high reliability such as a good electrical connection with the board.

According to the semiconductor device and method of production of the same of the present invention, as explained above, it is possible to easily form external connection terminals by bonding wires and thereby possible to simplify the steps for producing a semiconductor device. Further, according to the present invention, it is possible to improve the production efficiency of a semiconductor device and reduce the manufacturing costs of the semiconductor device. The present invention enables external connection terminals to be arranged at a high density and enables larger number of pins to be handled. Further, it is possible to provide a highly reliable semiconductor device where the external connection terminals are reliably bonded with the board.

While the invention has been described with reference to specific embodiments chosen for purpose of illustration, it should be apparent that numerous modifications could be made thereto by those skilled in the art without departing from the basic concept and scope of the invention.

The present disclosure relates to subject matter contained in Japanese Patent Application No. 2001-157451, filed on May 25, 2001, the disclosure of which is expressly incorporated herein by reference in its entirety.

What is claimed is:

1. A semiconductor device provided with:
   semiconductor elements formed on a semiconductor substrate,
   external connection terminals connecting these elements to an external circuit, and
   interconnection patterns connecting electrodes of the semiconductor elements to the external connection terminals,
   wherein the external connection terminals are formed by wires comprised of a conductive material, and
   the parts of the wires bonded to the interconnection patterns are buried in the metal layer forming the interconnection patterns.

2. A semiconductor device as set forth in claim 1, wherein the metal layer forming the interconnection patterns is formed by one of copper plating and gold plating.

3. A semiconductor device as set forth in claim 1, wherein the wires are selected from gold wires and copper wires.

4. A semiconductor device as set forth in claim 1, wherein the materials of the metal layer and the wires are the same.

5. A semiconductor device as set forth in claim 1, wherein the materials of the metal layer and the wires are gold.

6. A semiconductor device as set forth in claim 1, wherein the materials of the metal layer and the wires are copper.

7. A semiconductor device as set forth in claim 1, wherein the external connection terminals are covered by the material of the metal layer forming the interconnection patterns.

8. A semiconductor device as set forth in claim 1, wherein the surface of the semiconductor device where the interconnection patterns are formed is sealed so as to leave exposed the external connection terminals.

9. A semiconductor device as set forth in claim 3, wherein the surface of the semiconductor device where the interconnection patterns are formed is sealed so as to leave exposed the external connection terminals.

* * * * *